US010008647B2

(12) United States Patent
Odnoblyudov (10) Patent No.: US 10,008,647 B2
(45) Date of Patent: Jun. 26, 2018

(54) WAFER-LEVEL SOLID STATE TRANSDUCER PACKAGING TRANSDUCERS INCLUDING SEPARATORS AND ASSOCIATED SYSTEMS AND METHODS

(71) Applicant: Micron Technology, Inc., Boise, ID (US)

(72) Inventor: Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 14/614,382

(22) Filed: Feb. 4, 2015

(65) Prior Publication Data
US 2015/0171292 A1 Jun. 18, 2015

Related U.S. Application Data

(62) Division of application No. 13/190,971, filed on Jul. 26, 2011, now Pat. No. 8,952,395.

(51) Int. Cl.
*H01L 33/00* (2010.01)
*H01L 33/58* (2010.01)
(Continued)

(52) U.S. Cl.
CPC .............. *H01L 33/58* (2013.01); *H01L 27/15* (2013.01); *H01L 33/46* (2013.01); *H01L 33/486* (2013.01);
(Continued)

(58) Field of Classification Search
CPC .............................................. H01L 2933/0033
(Continued)

(56) References Cited

U.S. PATENT DOCUMENTS 6,649,437 B1 11/2003 Yang et al.
6,992,718 B1 * 1/2006 Takahara ................. 348/333.09
(Continued)

FOREIGN PATENT DOCUMENTS

KR  20070076895 A1  7/2007
KR   100752717 B1   8/2007
(Continued)

OTHER PUBLICATIONS

International Search Report and Written Opinion dated Jan. 31, 2013 in International Application No. PCT/US2012/045203, 7 pages.
(Continued)

*Primary Examiner* — Caleb Henry
*Assistant Examiner* — Alexander Belousov
(74) *Attorney, Agent, or Firm* — Perkins Coie LLP (57) ABSTRACT

Wafer-level packaging of solid-state transducers ("SSTs") is disclosed herein. A method in accordance with a particular embodiment includes forming a transducer structure having a first surface and a second surface opposite the first surface, and forming a plurality of separators that extend from at least the first surface of the transducer structure to beyond the second surface. The separators can demarcate lateral dimensions of individual SSTs. The method can further include forming a support substrate on the first surface of the transducer structure, and forming a plurality of discrete optical elements on the second surface of the transducer structure. The separators can form barriers between the discrete optical elements. The method can still further include dicing the SSTs along the separators. Associated SST devices and systems are also disclosed herein.

25 Claims, 10 Drawing Sheets

(51) Int. Cl.
    *H01L 33/48*     (2010.01)
    *H01L 33/46*     (2010.01)
    *H01L 27/15*     (2006.01)
    *H01L 33/50*     (2010.01)
    *H01L 33/54*     (2010.01)
    *H01L 33/60*     (2010.01)

(52) U.S. Cl.
    CPC ............ *H01L 33/507* (2013.01); *H01L 33/54* (2013.01); *H01L 33/0079* (2013.01); *H01L 33/0095* (2013.01); *H01L 33/60* (2013.01); *H01L 2924/0002* (2013.01); *H01L 2933/0033* (2013.01)

(58) Field of Classification Search
    USPC .... 438/26, 27, 28, 33, 40, 41; 257/E33.005, 257/E21.099
    See application file for complete search history.

(56) References Cited

U.S. PATENT DOCUMENTS

| | | |
|---|---|---|
| 7,115,896 B2 | 10/2006 | Guo et al. |
| 7,393,705 B1 | 7/2008 | Urbanek |
| 7,420,221 B2 | 9/2008 | Nagai |
| 7,646,033 B2 | 1/2010 | Tran et al. |
| 7,723,718 B1 | 5/2010 | Doan et al. |
| 7,741,632 B2 | 6/2010 | Xiong et al. |
| 7,758,695 B2 | 7/2010 | Xiong et al. |
| 7,846,751 B2 | 12/2010 | Wang |
| 8,361,880 B2 | 1/2013 | Jiang et al. |
| 8,435,816 B2 | 5/2013 | Xiong et al. |
| 2001/0022370 A1 | 9/2001 | Meyer-Guldner |
| 2006/0079082 A1 | 4/2006 | Bruhns et al. |
| 2007/0221944 A1 | 9/2007 | Cheol Yoo |
| 2008/0006836 A1 | 1/2008 | Lee |
| 2008/0048206 A1 | 2/2008 | Lee et al. |
| 2008/0142814 A1 | 6/2008 | Chu et al. |
| 2008/0173884 A1 | 7/2008 | Chitnis et al. |
| 2009/0134420 A1 | 5/2009 | Nagai |
| 2009/0283787 A1 | 11/2009 | Donofrio et al. |
| 2009/0321768 A1* | 12/2009 | Chang .................. H01L 33/647 257/98 |
| 2010/0067241 A1* | 3/2010 | Lapatovich ............ C09K 11/02 362/361 |
| 2010/0078656 A1 | 4/2010 | Seo et al. |
| 2010/0155766 A1 | 6/2010 | Ku |
| 2010/0193809 A1* | 8/2010 | Tsai ...................... H01L 25/167 257/98 |
| 2010/0213893 A1 | 8/2010 | Yamazaki et al. |
| 2010/0244263 A1 | 9/2010 | Lin et al. |
| 2010/0314605 A1 | 12/2010 | Khan |
| 2010/0314647 A1 | 12/2010 | Won et al. |
| 2011/0140080 A1 | 6/2011 | Xiong et al. |
| 2011/0156064 A1 | 6/2011 | Seo et al. |
| 2011/0169040 A1 | 7/2011 | Seo et al. |
| 2012/0007044 A1 | 1/2012 | Seo et al. |
| 2012/0007101 A1 | 1/2012 | Yang et al. |
| 2012/0074441 A1 | 3/2012 | Seo et al. |
| 2013/0026499 A1 | 1/2013 | Odnoblyudov |
| 2013/0052759 A1 | 2/2013 | Odnoblyudov et al. |

FOREIGN PATENT DOCUMENTS

| | | |
|---|---|---|
| KR | 20110078484 A1 | 7/2011 |
| WO | 2010020077 A1 | 2/2010 |

OTHER PUBLICATIONS

Philips Lumileds LUXEON Rebel White LED Product Image, Retrieved from the Internet on Jul. 16, 2011, URL: http://www.philipslumileds.com/products/luxeon-rebel/luxeon-rebel-white, 1 page.

Shchekin, O. and D. Sun, Evolutionary new chip design targets lighting systems, Compound Semiconductor, vol. 13, No. 2, pp. 16-18, Mar. 2007, Institute of Physics Publishing and IOP Publishing Ltd.

U.S. Appl. No. 13/218,289, filed Aug. 25, 2011 to Odnoblyudov et al.

Taiwan Office Action dated Jan. 22, 2015 in Taiwan Patent Application No. 101126380, 15 pages.

* cited by examiner

WAFER-LEVEL SOLID STATE TRANSDUCER PACKAGING TRANSDUCERS INCLUDING SEPARATORS AND ASSOCIATED SYSTEMS AND METHODS

CROSS REFERENCE TO RELATED APPLICATION

This application is a divisional of U.S. application Ser. No. 13/190,971 filed Jul. 26, 2011, now U.S. Pat. No. 8,952,395, which is incorporated herein by reference in its entirety.

TECHNICAL FIELD

The present technology is related to solid-state transducers and methods of manufacturing solid-state transducers. In particular, the present technology relates to wafer-level packaging for solid-state transducers and associated systems and methods.

BACKGROUND

Figure 1:
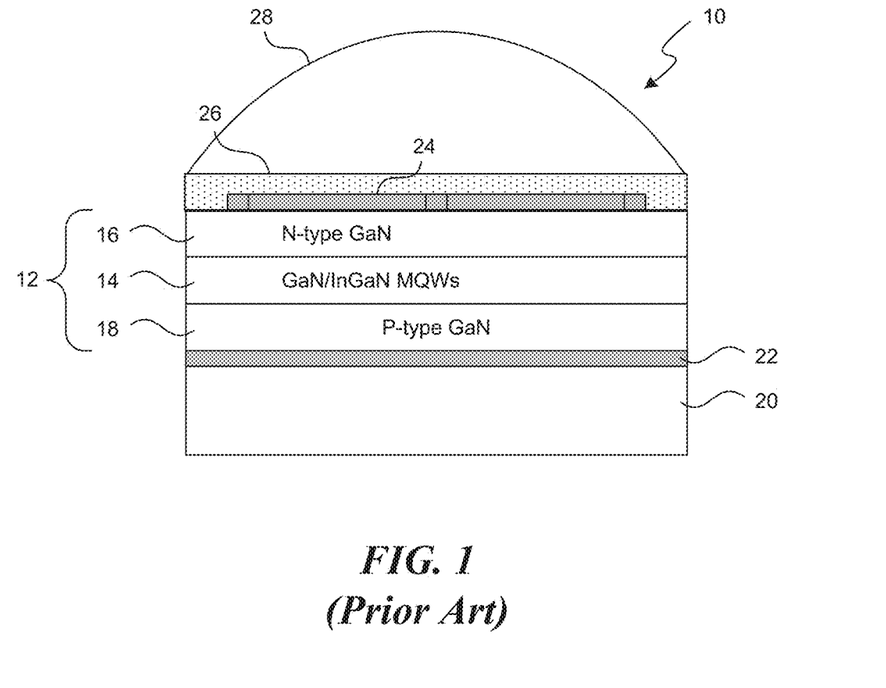
FIG. 1 is a schematic cross-sectional diagram of an LED device in accordance with the prior art.

Mobile phones, personal digital assistants ("PDAs"), digital cameras, MP3 players, and other electronic devices utilize light-emitting diodes ("LEDs"), organic light-emitting diodes ("OLEDs"), polymer light-emitting diodes ("PLEDs"), and other solid-state transducer devices for backlighting. Solid-state transducer devices are also used for signage, indoor lighting, outdoor lighting, and other types of general illumination. FIG. 1 shows a cross-sectional view of a conventional LED device 10 with vertical contacts. The LED device 10 includes a support substrate 20 carrying an LED structure 12 that has an active region 14 (e.g., containing gallium nitride/indium gallium nitride (GaN/InGaN) multiple quantum wells ("MQWs")) positioned between N-type gallium nitride ("N-GaN") 16 and P-type gallium nitride ("P-GaN") 18. The LED device 10 also includes a first contact 22 on the P-type GaN 18 and a second contact 24 opposite the first contact 22 on the N-type GaN 16. As further shown in FIG. 1, the LED device 10 can also include a converter material 26 and an encapsulant 28 positioned over one another on the LED structure 12. In operation, the LED structure 12 can emit a first emission (e.g., blue light) that stimulates the converter material 26 (e.g., phosphor) to emit a second emission (e.g., yellow light). The combination of the first and second emissions can generate a desired color of light (e.g., white light).

The LED structure 12 can be formed on a semiconductor wafer that includes several individual LED die. During conventional manufacturing processes, the wafers are cut into separate the LED die, and then the individual LED die are packaged and tested. For example, the LED structure 12 can be diced from a wafer-level LED structure and attached to the support substrate 20. The converter material 26 and the encapsulant 28 can then be formed over the front of the singulated LED structure 12.

A challenge associated with such conventional LED packaging is that forming the converter material 26 and the encapsulant 28 on singulated die requires precise handling that increases manufacture time and leads to increased packaging costs. Another concern is that mounting each LED die to a separate support substrate is also time consuming and requires more precise handling. Additionally, LED devices generally produce a significant amount of heat, and the different coefficients of thermal expansion between the LED structure and the underlying support substrate can result in delamination between the two or other damage to the packaged device.

DETAILED DESCRIPTION

Specific details of several embodiments of wafer-level packaging for solid-state transducers ("SSTs") and associated systems and methods are described below. The term "SST" generally refers to solid-state devices that include a semiconductor material as the active medium to convert electrical energy into electromagnetic radiation in the visible, ultraviolet, infrared, and/or other spectra. For example, SST devices include solid-state light emitters (e.g., LEDs, laser diodes, etc.) and/or other sources of emission other than electrical filaments, plasmas, or gases. The term SST can also include solid-state devices that convert electromagnetic radiation into electricity. Additionally, depending upon the context in which it is used, the term "substrate" can refer to a wafer-level substrate or to a singulated device-level substrate. A person skilled in the relevant art will also understand that the technology may have additional embodiments, and that the technology may be practiced without several of the details of the embodiments described below with reference to FIGS. 2A-5.

Figure 2A:
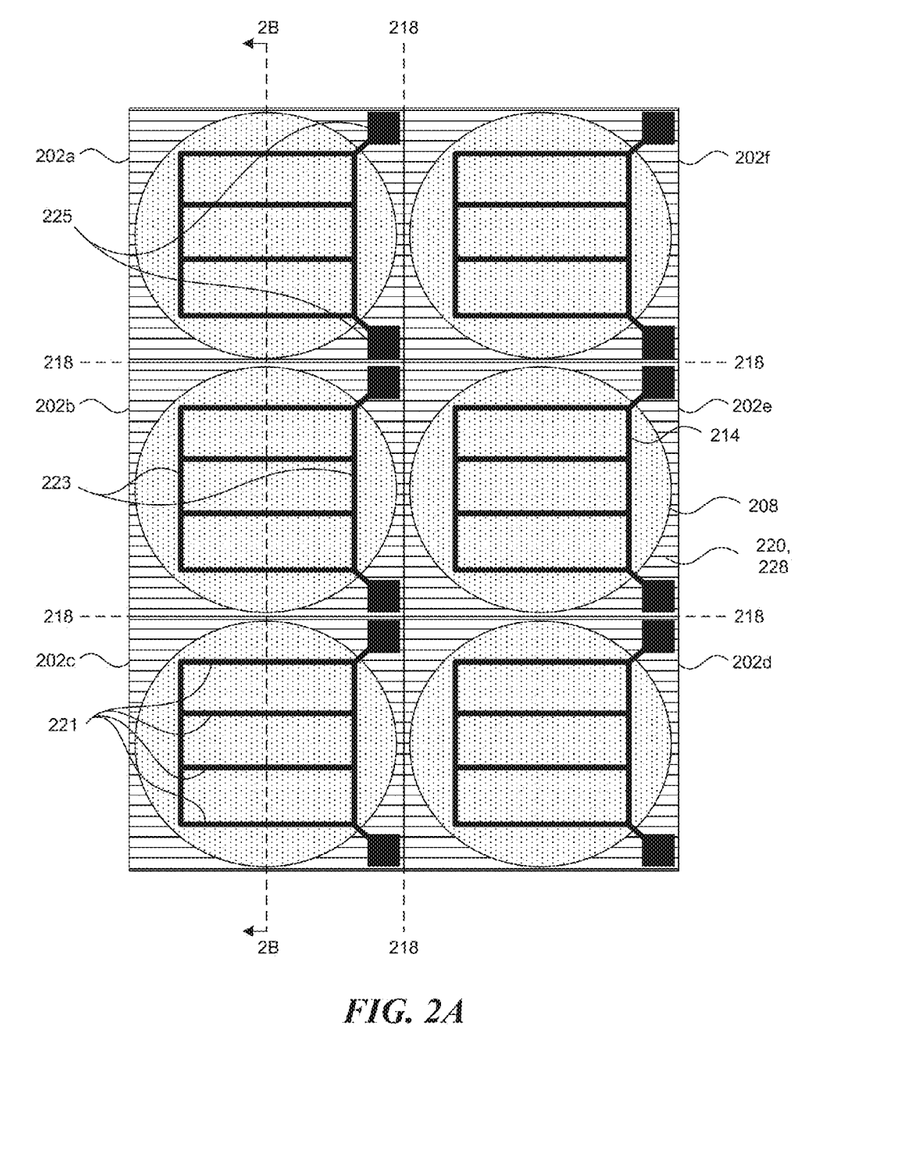
FIG. 2A is a schematic top plan view of a portion of a wafer-level assembly having a plurality of solid-state transducer die in accordance with an embodiment of the present technology.
Figure 2B:
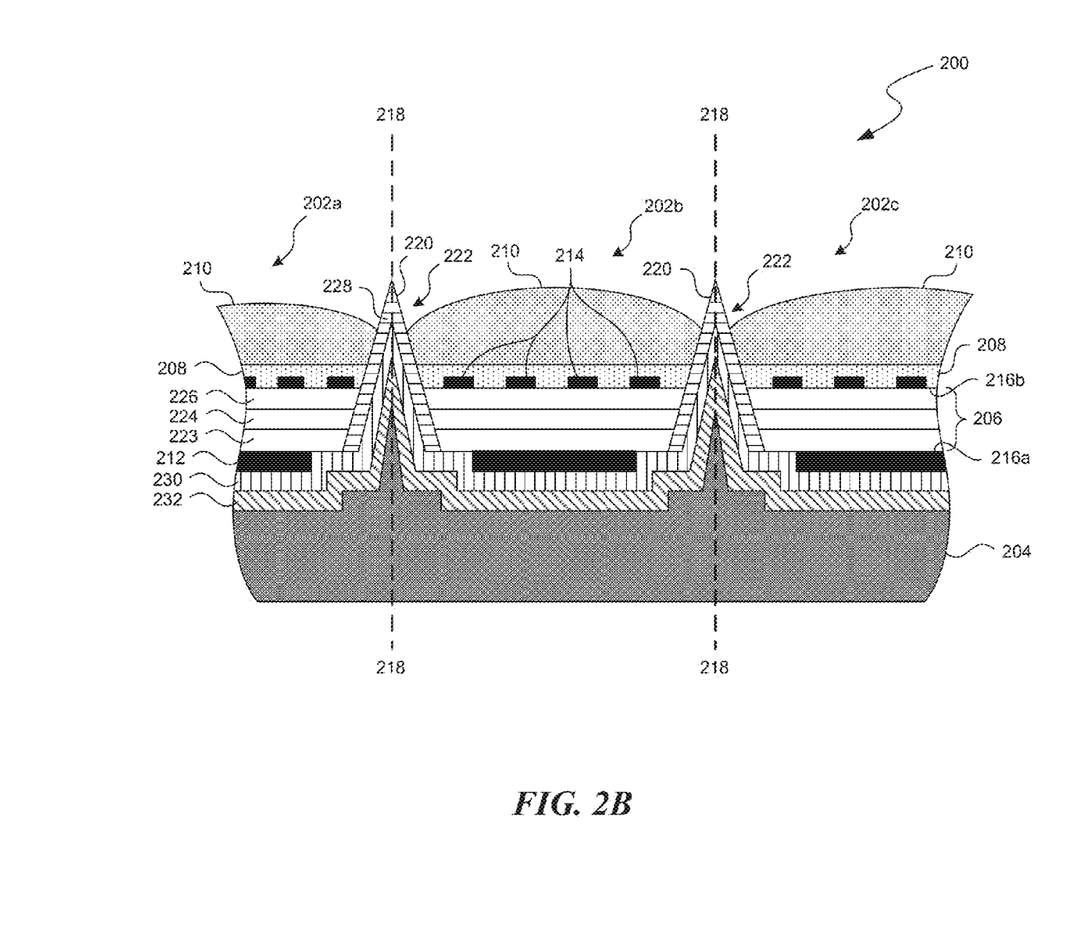
FIG. 2B is a schematic cross-sectional view of the wafer-level assembly of FIG. 2A taken view taken substantially along the line 2B-2B.

FIG. 2A is a schematic top plan view of a portion of a wafer-level assembly 200 ("assembly 200") having a plurality of SSTs 202 (identified individually as a first-sixth SSTs 202a-f, respectively) in accordance with an embodiment of the present technology, and FIG. 2B is a schematic cross-sectional view of the assembly 200 taken along lines 2B-2B of FIG. 2A. As shown in FIG. 2B, the assembly 200 can include a support substrate 204, a transducer structure 206, discrete converter elements 208, and discrete cover elements 210 positioned sequentially on one another. The converter elements 208 and cover elements 210 can define optical elements. For example, the cover elements 210 can be lenses. In several examples, each converter element 208 and corresponding cover element 210 can be combined into a single integrated converter/cover element. In other embodiments, each cover element 210 can be positioned over multiple SSTs 202, one cover element 210 can be positioned over the entire wafer-level assembly 200, or the cover elements 210 can be omitted. Similarly, the converter elements 208 can be positioned over more than one SST 202 or can be omitted. The assembly 200 can also include a plurality of separators 222 that are aligned with dicing lanes 218-218 to demarcate the boundaries of the individual SSTs 202. For clarity, the cover elements 210 are not shown in FIG. 2A such that the underlying features of the assembly 200 are visible.

The support substrate 204 of the assembly 200 can be made from a metal thick enough to support the transducer structure 206 and limit the amount of bowing of the support substrate 204. For example, the support substrate 204 can be made from copper that has a thickness between approximately 50 µm and 300 µm. In other embodiments, the support substrate 204 can be made from other metallic materials (e.g., gold, aluminum, etc.) and/or differ in thickness. In several embodiments, the metal support substrate 204 can be configured to have a coefficient of thermal expansion generally similar to that of the transducer structure 206 to decrease the likelihood of delamination between the two. Additionally, the metal support substrate 204 can function as a heat sink to decrease the operating temperature of the SSTs 202. In other embodiments, the support substrate 204 can be made from silicon, sapphire, and/or other non-metallic materials.

As shown in FIG. 2B, the transducer structure 206 can include a first semiconductor material 223, an active region 224, and a second semiconductor material 226 stacked sequentially on one another. The first semiconductor material 223 can be a doped semiconductor material, for example, a P-type semiconductor material (e.g., P-GaN) proximate a first surface 216a of the transducer structure 206 and electrically coupled to a plurality of first contacts 212 corresponding to the individual SSTs 202. The second semiconductor material 226 can be a doped semiconductor material, for example, an N-type semiconductor material (e.g., N-GaN) proximate a second surface 216b of the transducer structure 206 and electrically coupled to second contacts 214 corresponding to individual SSTs 202. This configuration is suitable for transducer structures that are formed on, for example, silicon or polycrystalline aluminum nitride growth substrates, and then removed from such growth substrates after being attached to the support substrate 204. In other embodiments, such as when the transducer structure 206 is formed on a sapphire growth substrate, the doped regions of the semiconductor material (i.e., the P-GaN and N-GaN) can be reversed. The active region 224 between the first and second semiconductor materials 223 and 226 can include a single quantum well ("SQW"), MQWs, and/or a single grain semiconductor material (e.g., InGaN). In other embodiments, the transducer structure 206 can include other suitable semiconductor materials, such as gallium arsenide (GaAs), aluminum gallium arsenide (Al-GaAs), gallium arsenide phosphide (GaAsP), etc.), and/or other semiconductor materials.

In several embodiments, the first contacts 212 on the first surface 216a of the transducer structure 206 can include a reflective material to redirect emissions (e.g., light) back through the transducer structure 206 toward the second surface 216b. For example, the first contacts 212 can include silver (Ag), copper (Cu), aluminum (Al), Nickel (Ni), tungsten (W), and/or other suitable reflective materials. In other embodiments, the first contacts 212 can be made from non-reflective materials and separate reflective elements can be positioned on the first surface 216a of the transducer structure 206 to redirect emissions toward the second surface 216b. In further embodiments, the SSTs 202 do not include reflective elements.

Referring to FIG. 2A, the second contacts 214 can each include a plurality of fingers 221 connected to one another by one or more cross members 223 and coupled to one or more current routers 225. Such a configuration enhances current spreading of the SSTs 202. The current routers 225 are positioned outside of the converter elements 208 and the cover elements 210 to allow for subsequent electrical connection (e.g., via wirebonds, solder bumps, etc.). The fingers 221 and/or the cross members 223 can individually include an elongated structure as shown in FIG. 2A and/or other suitable structures. In other embodiments, the second contacts 214 can have other suitable configurations. In several embodiments, the second contacts 214 are made from copper (Cu), aluminum (Al), silver (Ag), gold (Au), platinum (Pt), and/or other suitable electrically conductive materials. In other embodiments, the second contacts 214 can be a transparent electrode constructed from indium tin oxide ("ITO"), aluminum zinc oxide ("AZO"), fluorine-doped tin oxide ("FTO"), and/or other substantially transparent and conductive oxides.

The converter elements 208 can be formed over the second contacts 214 and the second surface 216b of the transducer structure 206 such that emissions (e.g., light) from the transducer structure 206 irradiate the converter elements 208. The irradiated converter elements 208 can emit a light of a certain quality (e.g., color, warmth, intensity, etc.). Accordingly, the converter elements 208 can include a phosphor containing a doped yttrium aluminum garnet (YAG) (e.g., cerium (III)) at a particular concentration for emitting a range of colors under photoluminescence. In other embodiments, the converter elements 208 can include silicate phosphor, nitrate phosphor, aluminate phosphor, and/or other suitable wavelength conversion materials. The converter elements 208 can have a generally rectangular cross-sectional shape as shown in FIG. 2B or have other suitable cross-sectional shapes (e.g., oval, irregular, etc).

Referring back to FIG. 2B, the cover elements 210 can be positioned over the converter elements 208 and transmit emissions generated by the transducer structure 206 and/or the converter elements 208. In the illustrated embodiment, the cover elements 210 are formed into generally hemispherical lenses on each of the SST 202. In other embodiments, the cover elements 210 can be formed into lenses having different shapes to collimate, scatter, and/or otherwise diffract light or other emissions from the transducer structure 206 and the converter elements 208.

The cover elements 210 can include a transmissive material made from silicone, polymethylmethacrylate (PMMA), resin, or other suitable transmissive materials. In selected embodiments, the cover elements 210 includes an additional converter element (not shown) that emits light at a different frequency than the converter elements 208 proximate the transducer structure 206.

The separators 222 shown in FIG. 2B are defined by protrusions 220 that extend through the transducer structure 206 and project beyond the second surface 216b of the transducer structure 206. For example, in selected embodiments, the protrusions 220 can extend from the first surface 216a of the transducer structure 206 beyond the cover elements 210 and have a height between approximately 10 µm and 30 µm. In other embodiments, the protrusions 220 can have greater or smaller heights and/or vary in height across the assembly 200. Additionally, the shape of the protrusions 220 may vary from that shown in FIGS. 2A and 2B. In illustrated embodiment, for example, the protrusions 220 have a generally V-shaped cross-section (FIG. 2B) and form a border (FIG. 2A) around the individual SSTs 202.

The border around the individual SSTs 202 can be rectangular, circular, oval, hexagonal, irregular, and/or any other suitable shape. In other embodiments, the protrusions 220 can have other suitable cross-sectional shapes.

As shown in FIG. 2B, each protrusion 220 can include one or more materials. In the illustrated embodiment, for example, the protrusions 220 include an outermost dielectric isolator 228, a barrier material 230 (e.g., WTi, Ta, TaN), an optional seed material 232 (e.g., Cu, Ni), and a portion of the support substrate 204. In selected embodiments, the dielectric isolator 228 can be an oxide passivation layer made from silicon oxide ($SiO_2$) or other suitable material that electrically isolates portions of the transducer structure 206 from one another that correspond to the individual SSTs 202. In other embodiments, the protrusions 220 can include additional materials and/or some of the materials shown in FIG. 2B can be omitted.

The protrusions 220 can provide a barrier between individual SSTs 202 that allows discrete converter elements 208 and discrete cover elements 210 to be formed over the individual SSTs 202 without spilling onto or otherwise contacting the adjacent SSTs 202. Accordingly, in selected embodiments, different converter elements 208 and/or cover elements 210 can be formed on the individual SSTs 202 based on desired performance parameters (e.g., color, intensity, etc.). The SSTs 202, therefore, can be fully packaged and subsequently tested at the wafer-level before dicing, thereby eliminating the need for precise handling of the diced SSTs 202 during packaging and testing. Additionally, as shown in FIG. 2A, the protrusions 220 can demarcate a dicing pattern between individual SSTs 202 and thereby serve as guides during dicing.

Figure 3A:
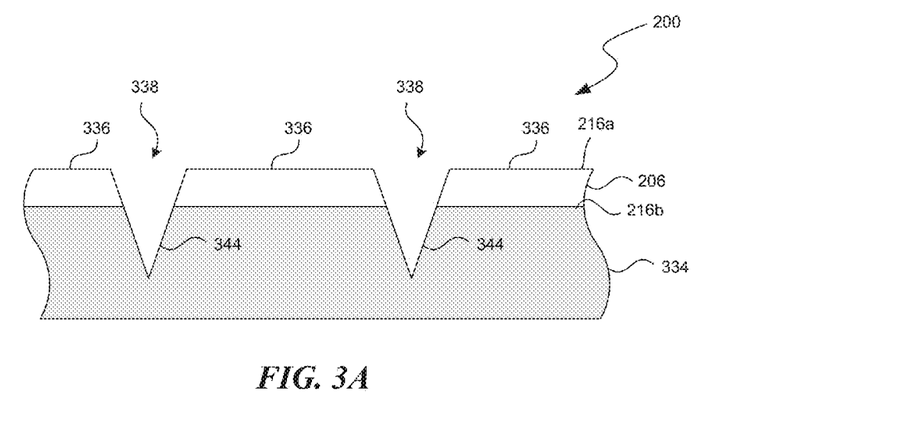
FIGS. 3A-3G are schematic cross-sectional views of a method of manufacturing solid-state transducers in accordance with an embodiment of the present technology.

FIGS. 3A-3H illustrate a process of forming an embodiment of the SSTs 202 of FIGS. 2A and 2B in accordance with an embodiment of the present technology. FIG. 3A shows a stage of the process after the transducer structure 206 has been formed on a growth substrate 334. The growth substrate 334 can be made from silicon, polycrystalline aluminum nitride, sapphire, and/or other suitable materials. The transducer structure 206 can be formed via metal organic chemical vapor deposition ("MOCVD"), molecular beam epitaxy ("MBE"), liquid phase epitaxy ("LPE"), and/or hydride vapor phase epitaxy ("HVPE"). In other embodiments, at least a portion of the transducer structure 206 may be formed using other suitable epitaxial growth techniques.

Additionally, as shown in FIG. 3A, a plurality of trenches 338 can be formed through the transducer structure 206 to separate the transducer structure 206 into mesas 336. The mesas 336 can define the lateral dimensions of the subsequently formed SSTs 202 (FIG. 3F), and the trenches 338 can have dimensions and shapes that correspond to the shapes and dimensions of the subsequently formed protrusions 220 (FIG. 3D). For example, as shown in FIG. 3A, the trenches 338 can have generally V-shaped cross-sections with sidewalls 344 that extend from the first surface 216a of the transducer structure 206 into a portion of the growth substrate 334. The trenches 338 can be formed by positioning a mask (not shown) over the areas above the mesas 336 and etching (e.g., wet etch, dry etch, etc.) through the exposed portions of the transducer structure 206 and the growth substrate 334. In other embodiments, the trenches 338 can be formed using other suitable removal methods. In further embodiments, the trenches 338 can be formed after the first contacts 212 (FIG. 3B) are formed on the first surface 216a of the transducer structure 206 such that the sidewalls 344 of the trenches 338 extend through the first contacts 212, the transducer structure 206, and a portion of the growth substrate 334.

Figure 3B:
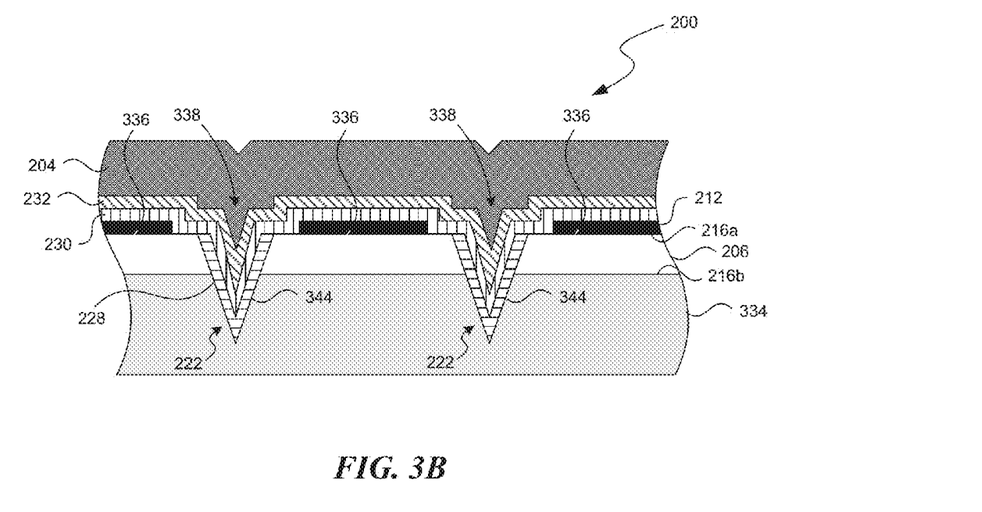

FIG. 3B illustrates a stage of the process after the first contacts 212, the separators 222, and the support substrate 204 are formed over the first surface 216a of the transducer structure 206. One or more materials can partially or fully fill the trenches 338 to form the separators 222. In the embodiment shown in FIG. 3B, for example, the dielectric isolators 228 are formed along the sidewalls 344 of the trenches 338, the first contacts 212 are formed on the mesas 336, and the barrier and seed materials 230 and 232 are sequentially formed over the dielectric isolators 228 and the first contacts 212. Each material can be formed using chemical vapor deposition ("CVD"), physical vapor deposition ("PVD"), atomic layer deposition ("ALD"), spin coating, patterning, and/or other suitable techniques known in the semiconductor fabrication arts. The dielectric isolators 228 can be formed by depositing a conformal dielectric and then removing the portions of the dielectric from the mesas 336 using an etching or chemical-mechanical process. In other embodiments, the dielectric isolators 228 can be formed by positioning a mask over the mesas 336 and depositing the dielectric in the trenches 338 and/or using other suitable formation techniques. In further embodiments, additional materials can be added and/or one or more of the materials can be omitted. For example, the trenches 338 can be filled entirely with a dielectric material instead of a conformal dielectric.

In other embodiments, the first contacts 212 can completely cover the mesas 336 and the dielectric isolators 228. Such a construction can be used when the dielectric isolators 228 are made from a substantially transparent material (e.g., silicon oxide, silicon nitride, etc.) and the first contacts 212 are made of a reflective material (e.g., silver, gold, etc.) such that the first contacts 212 can redirect emissions back through the dielectric isolators 228 and the transducer structure 206.

If made of metal, the support substrate 204 can be plated onto the seed material 232. Plating the metal substrate 204 over the first side 216a of the transducer structure 206 eliminates the need for thermo-compression and inter-metallic compound bonding and enables the assembly 200 to have a larger diameter because the support substrate 204 inhibits bowing of the support substrate 204. In several embodiments, for example, the assembly 200 can be at least four inches in diameter, and in many cases between six and eight inches in diameter without undo bowing. In other embodiments, the support substrate 204 can include a non-metallic material and/or be attached to the assembly 200 using other suitable methods.

Figure 3C:
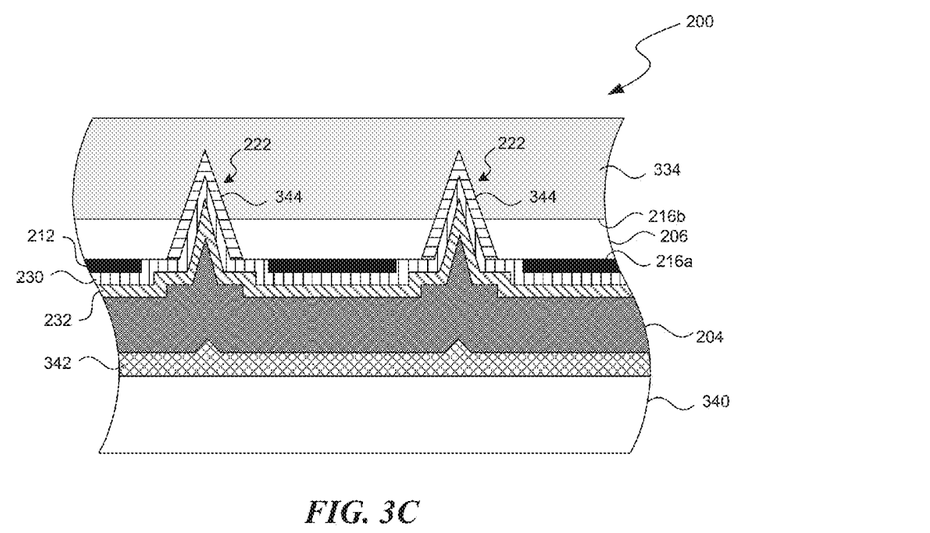
Figure 3D:
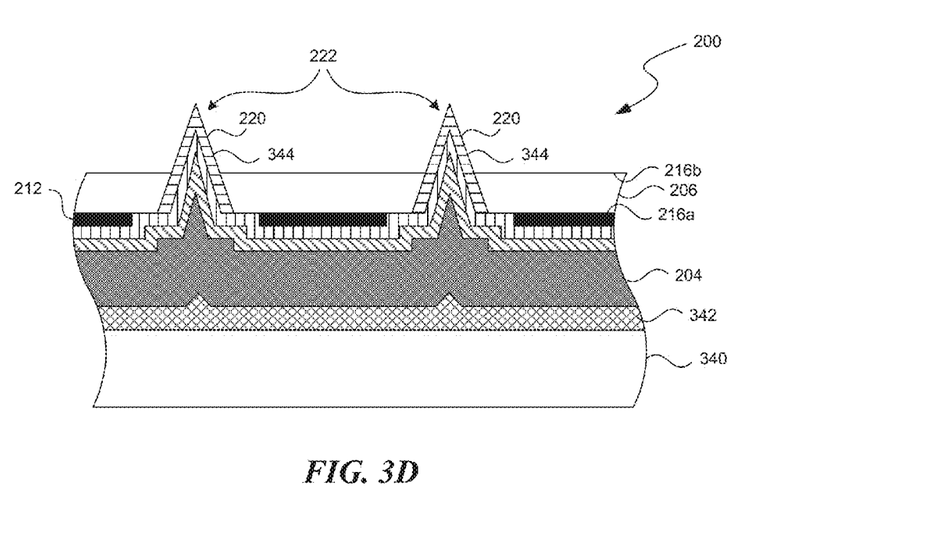

FIG. 3C illustrates another stage in the process after the assembly 200 is inverted and a carrier substrate 340 is attached to the support substrate 204. The carrier substrate 340 can be made from silicon and/or other suitable substrate materials that can support the assembly 200 during subsequent fabrication stages. The carrier substrate 340, for example, can provide a temporary platform that can reduce or prevent bowing of the wafer through the fabrication. The carrier substrate 340 can therefore be attached to the support substrate 204 with a temporary adhesive 342 (e.g., Wafer-BOND™ HT-10.10 from Brewer Science, Inc. of Rolla, Mo.) that can bond the two substrates 204 and 340 together for subsequent processing, and then be manipulated to separate the substrates 204 and 340 before or after dicing of the SSTs 202. In other embodiments, the carrier substrate 340 can be omitted during processing.

FIG. 3D illustrates a subsequent stage in the process after the growth substrate 334 has been removed from the assembly 200. As shown in FIG. 3D, the growth substrate 334 can be removed such that at least a portion of the individual separators 222 remains. As a result, the separators 222 project beyond the second side 216b of the transducer structure 206 to form the protrusions 220. The growth substrate 334 can be removed by backgrinding, etching, and/or other suitable removal methods. For example, removing the growth substrate 334 can include backgrinding the growth substrate 334 to the ends of the separators 222, and etching the remaining portions of the growth substrate 334 away from the sidewalls 334 and the second surface 216b of the transducer structure 206.

Figure 3E:
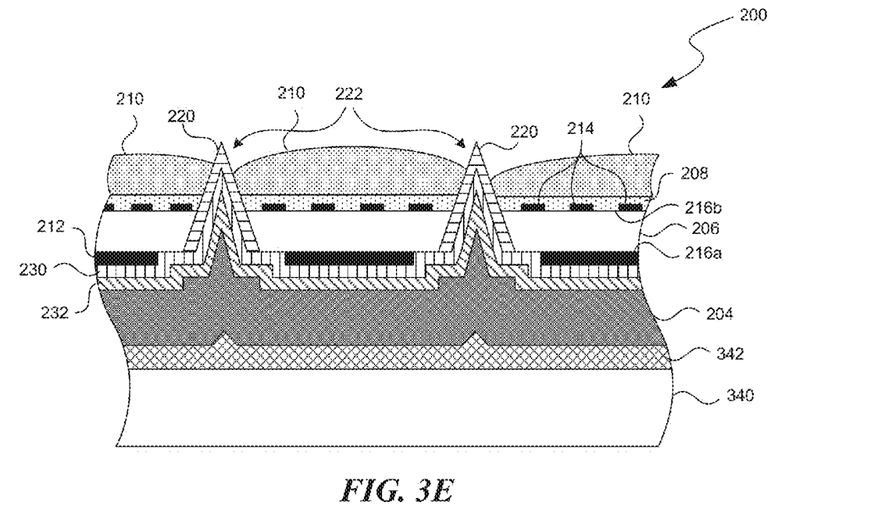

FIG. 3E shows a further stage in the process after the second contacts 214, the converter elements 208, and the cover elements 210 have been formed over the second surface 216b of the transducer structure 206. The second contacts 214 can be formed using CVD, ALD, PVD, patterning and/or other suitable formation techniques. Optionally, the second surface 216b can be roughened before the second contacts 214 are formed. In selected embodiments, such as the embodiment shown in FIG. 2A, the second contacts 214 can include interconnected fingers 221, cross members 223, and current routers 225 to enhance current spreading. In other embodiments, the second contacts 214 can have different structures.

The converter elements 208 and the cover elements 210 can be formed over the second surface 216b of the transducer structure 206 using ink jetting techniques, spin coating and patterning, CVD, PVD, and/or other suitable deposition techniques. In other embodiments, the cover elements 210 can be pre-formed into lenses that are subsequently attached over the individual SSTs 202. During such packaging, the protrusions 220 can provide barriers between the SSTs 202 that allow the formation of discrete portions of the converter elements 208 and the cover elements 210 over the individual SSTs 202, without the converter elements 208 and the cover elements 210 spreading onto or otherwise contacting the adjacent SSTs 202. This enables selective deposition of different converter elements 208 and/or different cover elements 210 over adjoining SSTs 202.

Figure 3F:
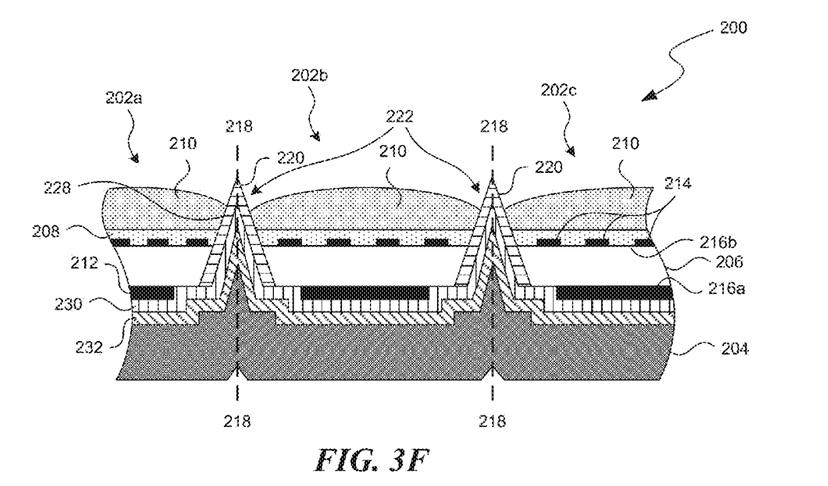
Figure 3G:
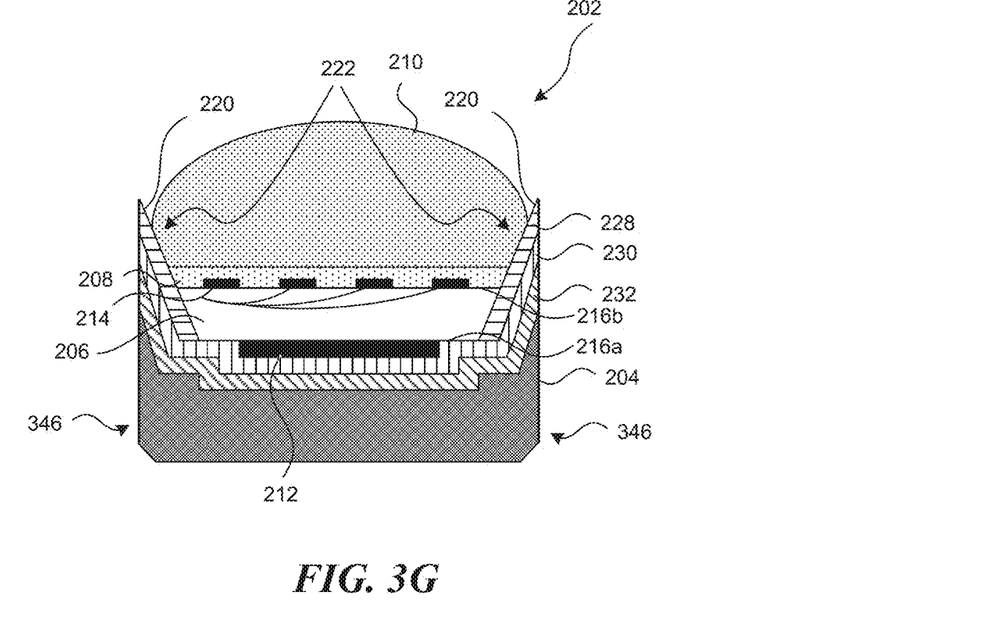

FIGS. 3F and 3G illustrate additional stages of the process after the carrier substrate 340 has been removed, and the assembly 200 has been diced along the dicing lanes 218-218. The carrier substrate 340 can be removed by backgrinding, etching, de-bonding, and/or other suitable removal techniques. When heat is used to de-bond the carrier substrate 340 from the support substrate 204, the cover elements 210 may be formed after the carrier substrate 340 has been de-bonded.

Before or after removal of the carrier substrate 340, the assembly 200 can undergo peak wavelength testing and/or testing of performance parameters (e.g., intensity) of the individual SSTs 202. Such wafer-level testing can be performed on the partially or fully packaged SSTs 202 such that they can be pre-sorted according to predetermined test limits in a process known as "binning" For example, the assembly 200 can also undergo lambda testing before the converter elements 208 are deposited. The converter elements 208 can then be selected accordingly for individual SSTs 202 to generate a generally uniform color across the assembly 200 and thereby simplify binning. The wafer-level testing of the SSTs 202 also requires less precise handling than testing the diced SSTs 202.

The dicing lanes 218-218 can be aligned with the separators 222. As shown in FIG. 3G, dicing along the dicing lanes 218-218 forms SSTs 202 that have peripheral portion 346 defined by the separators 222 that borders the transducer structure 206, converter elements 208, and the cover elements 210. In other embodiments, the separators 222 can be removed from the SST 202 during dicing or subsequent removal processes. The packaged SST 202 is ready for use after dicing, and can thus be immediately incorporated into devices for backlighting, general illumination, and/or other emissions in the ultraviolet, visible, infrared, and/or other spectra. During operation, the metal support substrate 204 can enhance the thermal performance of the SSTs 202.

Figure 4A:
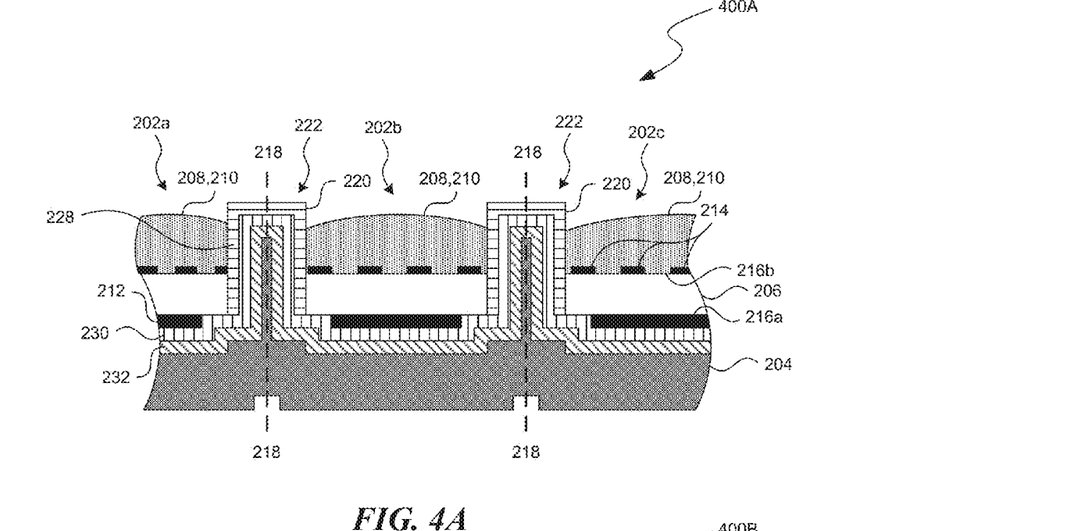
FIGS. 4A-4C are schematic cross-sectional views of wafer-level assemblies having a plurality of solid-state transducer die in accordance with other embodiments of the present technology.
Figure 4B:
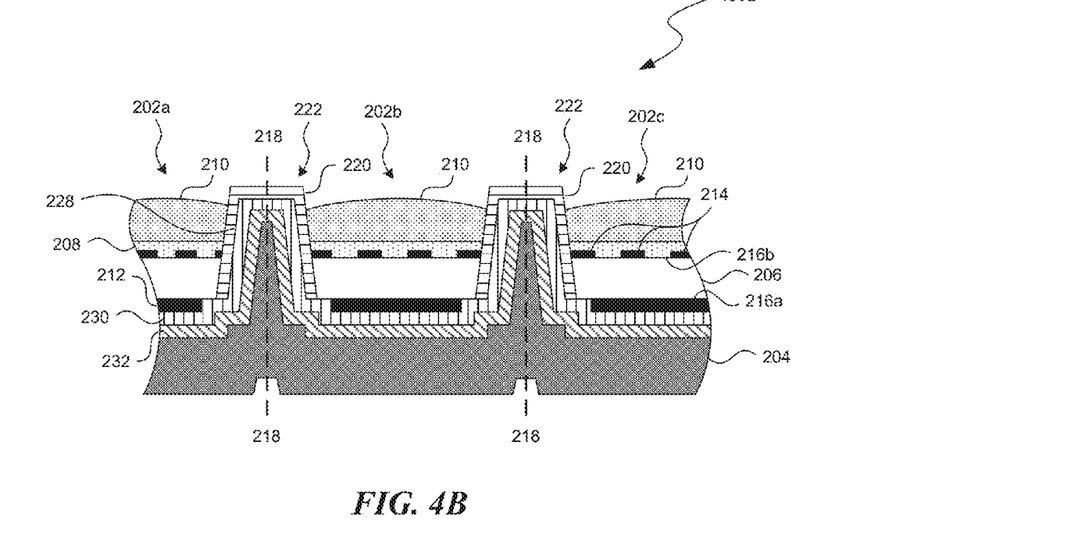
Figure 4C:
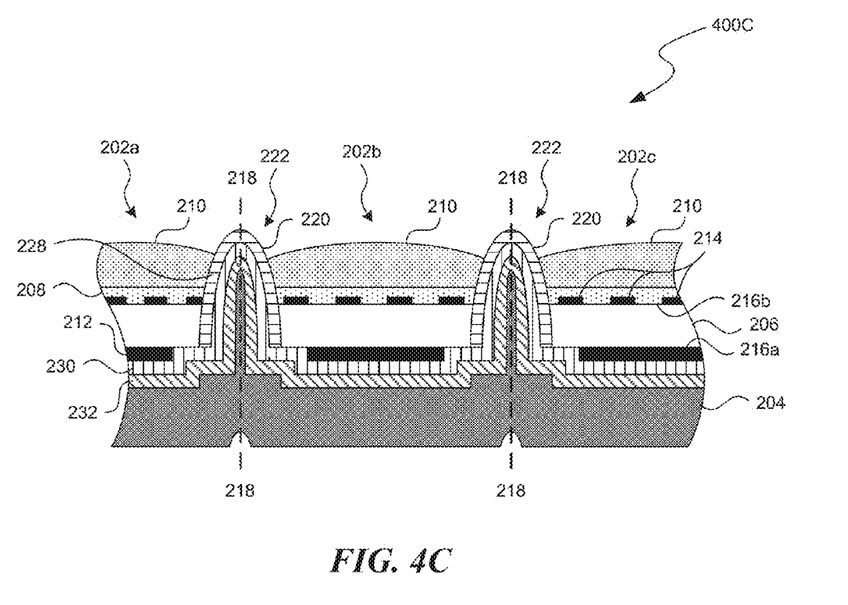

FIGS. 4A-4C are schematic cross-sectional views of wafer-level assemblies 400A-C ("assemblies 400A-C") in accordance with other embodiments of the technology. Several features of the assemblies 400A-C are generally similar to the features of the assembly 200 described above with reference to FIGS. 2A-3G. For example, the assemblies 400A-C include the support substrate 204, the transducer structure 206, the converter elements 208, and the cover elements 210. However, in the embodiment illustrated in FIG. 4A, the converter elements 208 and the cover elements 210 are combined as a single optical element over each SST 202. Additionally, as shown in FIGS. 4A-4C, rather than the V-shaped protrusions 220 described above, the assemblies 400A-C include protrusions 220 having a rectangular, a trapezoidal, and an oval cross section in FIGS. 4A-4C, respectively. However, no one type of device is limited to a particular shape of protrusion 220. In other embodiments, the protrusions 220 can also include other suitable cross-sectional shapes. As shown in FIGS. 4A-4C, the protrusions 220 extend beyond the second surface 216b of the transducer structure 206 and define the separators 222 that demarcate the individual SSTs 202. As described above, the protrusions 220 can facilitate wafer-level packaging and testing of the SSTs 202.

Figure 5:
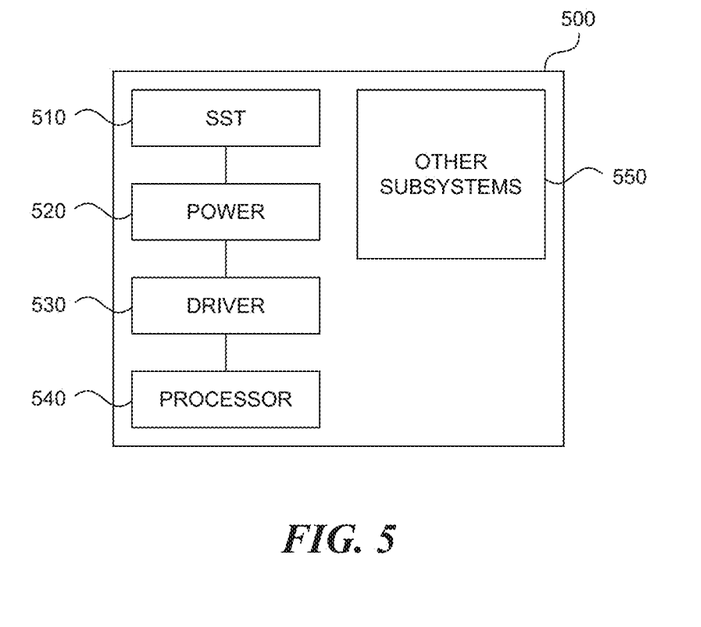
FIG. 5 is a schematic view of a system that incorporates a packaged solid-state transducer device in accordance with embodiments of the present technology.

Any one of the packaged SST described above with reference to FIGS. 2A-4C can be incorporated into any of a myriad of larger and/or more complex systems, a representative example of which is system 500 shown schematically in FIG. 5. The system 500 can include an SST device 510, a power source 520, a driver 530, a processor 540, and/or other subsystems or components 550. The resulting system 500 can perform any of a wide variety of functions, such as backlighting, general illumination, power generation, sensors, and/or other functions. Accordingly, representative systems 500 can include, without limitation, hand-held devices (e.g., cellular or mobile phones, tablets, digital readers, and digital audio players), lasers, photovoltaic cells, remote controls, computers, and appliances (e.g., refrigerators). Components of the system 500 may be housed in a single unit or distributed over multiple, interconnected units (e.g., through a communications network). The components of the system 500 can also include local and/or remote memory storage devices, and any of a wide variety of computer-readable media.

From the foregoing, it will be appreciated that specific embodiments of the technology have been described herein for purposes of illustration, but that various modifications may be made without deviating from the disclosure. For example, even though only one converter element 208 is shown in the Figures, in other embodiments, the assemblies 200 and 400A-C and/or the individual SSTs 202 may include two, three, four, or any other suitable number of converter elements with different emission center wavelengths and/or other characteristics. Additionally, the method of forming the SSTs described above with reference to FIGS. 3A-3G includes forming trenches 338 before forming the first contacts. In other embodiments, the first contacts 212 can be formed on the transducer structure 206, and the trenches 338 can be subsequently formed through the first contacts 212, the transducer structure 206, and a portion of the growth substrate 334. Certain aspects of the new technology described in the context of particular embodiments may be combined or eliminated in other embodiments. For example, a assembly in accordance with an embodiment of the technology can include varying shapes of protrusions 220, such as alternating the V-shaped protrusions shown in FIGS. 2B-3G and the oval-shaped protrusions shown in FIG. 4C. Additionally, while advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

I claim:

1. A solid-state transducer (SST) assembly comprising:
   a support substrate comprising a metal material;
   a barrier material extending over the support substrate;
   a plurality of SSTs, wherein individual SSTs include first contacts, a transducer structure, and second contacts stacked sequentially, and wherein the transducer structure has a first surface proximate to the support substrate and a second surface opposite the first surface;
   a plurality of separators demarcating the individual SSTs, wherein the separators include a dielectric material over a portion of the metal material of the support substrate, wherein the dielectric material projects from the first surface of the transducer structure, and wherein the dielectric material and the barrier material each includes a topmost surface that extends beyond the second surface of the transducer structure and uppermost surfaces of the second contacts; and
   a plurality of discrete optical elements over the second surface of the transducer structure of corresponding ones of the SSTs, wherein each of the discrete optical elements includes a cover element having a topmost surface that is above the topmost surface of the dielectric material of a corresponding one of the discrete elements,
   wherein the separators form barriers between the discrete optical elements of the individual SSTs, and wherein the dielectric material of each of the separators abuts the cover element of a corresponding one of the discrete optical elements.

2. The SST assembly of claim 1 wherein each of the separators comprises the portion of the metal material, and wherein the portion of the metal material projects beyond the second surface of the transducer structure.

3. The SST assembly of claim 1 wherein the metal material comprises a plated metal.

4. The SST assembly of claim 3 wherein the plated metal forms a portion of the separators.

5. The SST assembly of claim 3 wherein the plated metal has a thickness between approximately 50 μm and approximately 300 μm.

6. The SST assembly of claim 1 wherein each of the discrete optical elements further comprises a discrete converter element having a planar surface and that encapsulates the second contacts of each SST and is between corresponding ones of the separators and the discrete cover elements.

7. The SST assembly of claim 1 wherein the separators are aligned with dicing lanes.

8. The SST assembly of claim 1 wherein SSTs are configured to emit electromagnetic radiation in at least one of the ultraviolet spectrum, the visible spectrum, and the infrared spectrum.

9. The SST assembly of claim 1 wherein the dielectric material includes a first end co-planar with the first surface of the transducer structure, and wherein the dielectric material extends from the first surface of the transducer structure of one of the SSTs to the first surface of the transducer structure of another one of the other SSTs, thereby covering the portion of the metal material.

10. The SST assembly of claim 1 wherein each of the second contacts includes a plurality of interconnected fingers and cross members.

11. The SST assembly of claim 1 wherein each of the second contacts includes at least one of a yttrium aluminum garnet, silicate phosphor, nitrate phosphor and aluminate phosphor.

12. The SST assembly of claim 1 wherein the discrete optical element encapsulates the plurality of second contacts.

13. A solid state transducer (SST), comprising:
   a transducer structure having a first surface and a second surface opposite the first surface;
   a contact on the second surface of the transducer structure;
   a support substrate on the first surface, the support substrate including a metal material;
   a barrier material having a portion between the support substrate and the transducer structure;
   a protrusion around a periphery of the transducer structure, the protrusion including a dielectric material projecting from a portion of the metal material, wherein the portion of the metal material is below the first surface of the transducer structure, and wherein the dielectric material and barrier material each includes a topmost surface extending beyond an uppermost surface of the contact on the second surface of the transducer structure; and
   an optical element over the second surface of the transducer structure, the optical element including a cover element and a converter element between the cover element and the transducer structure, the cover element including a topmost surface that is above the topmost surface of the dielectric material of the protrusion.

14. The SST of claim 13 wherein the metal material comprises a plated metal.

15. The SST of claim 14 wherein the plated metal defines a portion of the protrusion.

16. The SST of claim 13 wherein the SST is configured to emit electromagnetic radiation in at least one of the ultraviolet spectrum, the visible spectrum, and the infrared spectrum.

17. The SST of claim 13 wherein the converter element and the cover element are confined within the protrusion.

18. The SST of claim 13, wherein a portion of the dielectric material abuts the cover element.

19. The SST of claim 13 wherein the dielectric material is formed from a single, uniform material and has uniform straight edges.

20. A solid-state transducer (SST) assembly, comprising:
   a support substrate;
   a plurality of transducer structures on the support substrate;
   a plurality of contacts on each of the transducer structures, wherein each of the contacts has an uppermost surface;

a barrier material at least partially between the support substrate and the transducer structure, wherein a portion of the barrier material projects beyond the uppermost surface of each of the contacts;

a plurality of discrete optical elements over corresponding ones of the transducer structures, the discrete optical elements each including a cover element having a topmost surface; and a plurality of separators demarcating the transducer structures and forming barriers between the discrete optical elements, wherein each of the separators includes a metal material and a dielectric isolator over the metal material, and wherein the dielectric isolator includes— a first portion between the metal material and a corresponding one of the transducer structures, and a second portion projecting from the first portion and having a topmost surface that is above the uppermost surface of each of the contacts and below the topmost surface of the cover element of a corresponding one of the discrete optical elements.

21. The SST assembly of claim 20 wherein each of the discrete optical elements further includes a converter element between the cover element and a corresponding one of the transducer structures.

22. The SST assembly of claim 20 wherein each of the transducer structures has a surface proximate to the support substrate, and wherein the first portion of the dielectric isolator projects from the surface proximate to the support substrate.

23. The SST assembly of claim 22 wherein the dielectric isolator includes a third portion between the metal material and another one of the transducer structures, wherein the second portion of the dielectric isolator extends between the first and third portions, thereby covering the metal material.

24. The SST assembly of claim 20 wherein the second portion of the dielectric isolator abuts a corresponding one of the discrete optical elements.

25. The SST assembly of claim 20 wherein the plurality of second contacts includes a plurality of interconnected fingers and cross members, the second contacts being configured to enhance current spreading.

* * * * *